US011339477B2

(12) United States Patent
    Zong (10) Patent No.: US 11,339,477 B2
(45) Date of Patent: *May 24, 2022

(54) PLASMA POLYMERIZATION COATING APPARATUS AND PROCESS

(71) Applicant: Jiangsu Favored Nanotechnology Co., LTD, Wuxi (CN)

(72) Inventor: Jian Zong, Wuxi (CN)

(73) Assignee: Jiangsu Favored Nanotechnology Co., LTD, Wuxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,537

(22) Filed: Nov. 19, 2018

(65) Prior Publication Data

US 2019/0085447 A1    Mar. 21, 2019
US 2021/0371979 A9    Dec. 2, 2021

Related U.S. Application Data

(63) Continuation-in-part of application No. PCT/CN2017/112918, filed on Nov. 24, 2017, and a
(Continued)

(30) Foreign Application Priority Data

Nov. 30, 2016 (CN) .......................... 201611076904.8
Nov. 30, 2016 (CN) .......................... 201611076982.8

(51) Int. Cl.
    *C23C 16/458*    (2006.01)
    *H01J 37/32*     (2006.01)
    (Continued)

(52) U.S. Cl.
    CPC ............ *C23C 16/4584* (2013.01); *B05D 1/60* (2013.01); *B05D 1/62* (2013.01); *B05D 3/141* (2013.01);
    (Continued)

(58) Field of Classification Search
    CPC . C23C 16/4584; C23C 16/4581; C23C 16/52; C23C 16/0227; C23C 16/4583;
    (Continued)

(56) References Cited

U.S. PATENT DOCUMENTS 4,632,842 A    12/1986   Karwoski et al.
4,828,369 A     5/1989   Hotomi
                          (Continued)

FOREIGN PATENT DOCUMENTS

CN     87106283 A      3/1988
CN     2848874 Y      12/2006
                (Continued)

OTHER PUBLICATIONS

English Machine Translation of Zong (CN-206304929-U) retrieved from ESPACENT dated Mar. 2, 2021 (Year: 2021).*
(Continued)

*Primary Examiner* — Ram N Kackar
*Assistant Examiner* — Laureen Chan
(74) *Attorney, Agent, or Firm* — Perkins Coie LLP (57) ABSTRACT

Introduced here is a plasma polymerization apparatus. Example embodiments include a reaction chamber in a shape substantially symmetrical to a central axis. Some examples further include a rotation rack in the reaction chamber. The rotation rack may be operable to rotate relative to the reaction chamber about the central axis of the reaction chamber. Examples may further include reactive species discharge mechanisms positioned around a perimeter of the reaction chamber and configured to disperse reactive species into the reaction chamber in a substantially symmetrical manner from the outer perimeter of the reaction chamber toward the central axis of the reaction chamber, such that the reactive species form a polymeric coating on surfaces of the one or more substrates during said dispersion of the reactive
(Continued)

species, and a collecting tube positioned along the central axis of the reaction chamber and having an air pressure lower than the reaction chamber.

18 Claims, 4 Drawing Sheets

Related U.S. Application Data continuation-in-part of application No. 15/890,476, filed on Feb. 7, 2018, now Pat. No. 10,424,465, which is a continuation-in-part of application No. PCT/CN2017/081773, filed on Apr. 25, 2017.

(51) Int. Cl.
| | | |
|---|---|---|
| *C23C 16/02* | (2006.01) | |
| *B05D 1/00* | (2006.01) | |
| *C23C 16/52* | (2006.01) | |
| *C23C 16/30* | (2006.01) | |
| *B05D 3/14* | (2006.01) | |
| *C23C 16/515* | (2006.01) | |
| *C23C 16/44* | (2006.01) | |

(52) U.S. Cl.
CPC .......... *C23C 16/0227* (2013.01); *C23C 16/30* (2013.01); *C23C 16/4412* (2013.01); *C23C 16/515* (2013.01); *C23C 16/52* (2013.01); *H01J 37/3244* (2013.01); *H01J 37/32082* (2013.01); *H01J 37/32541* (2013.01); *H01J 37/32715* (2013.01); *H01J 2237/20214* (2013.01); *H01J 2237/3323* (2013.01)

(58) Field of Classification Search
CPC ............ C23C 16/4587; C23C 16/4588; C23C 14/505; C23C 16/50; C23C 16/455; C23C 16/452; C23C 16/4558; H01J 37/32541; H01J 37/3244; H01J 37/32082; H01J 37/32715; H01J 2237/20214; H01J 2237/3323; H01J 37/32733; H01J 37/32752; H01J 37/32779; H01J 37/32449; B05D 1/60; B05D 1/62; H01L 21/68764

See application file for complete search history.

(56) References Cited

U.S. PATENT DOCUMENTS

| | | | | |
|---|---|---|---|---|
| 4,851,256 | A | * | 7/1989 | Matsuyama ............ C23C 16/24 427/578 |
| 4,926,793 | A | * | 5/1990 | Arima ...................... C23C 8/36 118/715 |
| 4,996,077 | A | | 2/1991 | Moslehi et al. |
| 5,279,669 | A | | 1/1994 | Lee |
| 5,286,297 | A | * | 2/1994 | Moslehi .............. C23C 16/4405 118/723 E |
| 5,591,268 | A | | 1/1997 | Usui et al. |
| 5,653,811 | A | * | 8/1997 | Chan ...................... H01J 37/20 118/723 I |
| 6,471,837 | B1 | * | 10/2002 | Hans .......................... B01J 3/03 118/500 |
| 6,582,578 | B1 | | 6/2003 | Dordi et al. |
| 8,961,694 | B2 | | 2/2015 | Wieringa et al. |
| 2005/0211171 | A1 | * | 9/2005 | Hanawa ................ C23C 16/045 118/723 R |
| 2006/0102588 | A1 | | 5/2006 | Han et al. |
| 2006/0185592 | A1 | * | 8/2006 | Matsuura .......... H01L 21/31116 118/715 |
| 2008/0173238 | A1 | | 7/2008 | Nakashima et al. |
| 2009/0159428 | A1 | | 6/2009 | Miller et al. |
| 2010/0059085 | A1 | * | 3/2010 | Wieringa .......... H01J 37/32357 134/1.1 |
| 2011/0120649 | A1 | * | 5/2011 | Satou .................. H01J 37/3244 156/345.27 |
| 2012/0100722 | A1 | | 4/2012 | Asai et al. |
| 2012/0238103 | A1 | * | 9/2012 | Zhang ...................... C23F 4/00 438/720 |
| 2012/0272892 | A1 | * | 11/2012 | Paranjpe ................. C30B 25/10 117/86 |
| 2013/0134033 | A1 | | 5/2013 | Lyo et al. |
| 2013/0168352 | A1 | | 7/2013 | Fischer |
| 2015/0136029 | A1 | * | 5/2015 | Fujii ..................... C23C 14/505 118/730 |
| 2015/0275359 | A1 | * | 10/2015 | Fukushima ......... C23C 16/4412 118/712 |
| 2015/0329968 | A1 | * | 11/2015 | Tamagaki .......... C23C 16/4409 118/723 E |
| 2016/0138159 | A1 | * | 5/2016 | Kato ................. C23C 16/45551 118/730 |
| 2018/0096818 | A1 | * | 4/2018 | Lubomirsky ......... H01J 37/321 |
| 2019/0085447 | A1 | | 3/2019 | Zong |
| 2019/0338421 | A1 | | 11/2019 | Zong |

FOREIGN PATENT DOCUMENTS

| | | |
|---|---|---|
| CN | 102024658 A | 4/2011 |
| CN | 102296284 A | 12/2011 |
| CN | 103703163 A | 4/2014 |
| CN | 204497191 U | 7/2015 |
| CN | 104903491 A | 9/2015 |
| CN | 105949836 A | 9/2016 |
| CN | 106637140 A | 5/2017 |
| CN | 106756888 A | 5/2017 |
| CN | 206219660 U | 6/2017 |
| CN | 206304929 U * | 7/2017 |
| CN | 206304929 U | 7/2017 |
| CN | 206359611 U | 7/2017 |
| JP | S5938375 A | 3/1984 |
| JP | S59211220 A | 11/1984 |
| JP | S6043488 A | 3/1985 |
| JP | H01205078 A | 8/1989 |
| JP | 2007297661 A | 11/2007 |
| WO | 2015188354 A1 | 12/2015 |
| WO | 2018099333 A1 | 6/2018 |

OTHER PUBLICATIONS

International Search Report dated Feb. 28, 2018 cited in PCT/CN2017/112918.
Written Opinion dated Feb. 28, 2018 cited in PCT/CN2017/112918.
CN 102024658 Wei (2011) English Machine Translation retrieved from ESPACENET dated Apr. 23, 2018 (Year: 2011).

* cited by examiner

PLASMA POLYMERIZATION COATING APPARATUS AND PROCESS

CROSS-REFERENCE TO RELATED APPLICATIONS

This application is a continuation-in-part (CIP) of Patent Cooperation Treaty (PCT) Patent Application No. PCT/CN2017/112918, filed Nov. 24, 2017, which claims priority to Chinese Invention Patent Application No. 201611076982.8, filed Nov. 30, 2016, and is also a CIP of U.S. patent application Ser. No. 15/890,476, filed Feb. 7, 2018, all of which are incorporated herein by reference in their entirety.

TECHNICAL FIELD

The present disclosure relates to plasma polymerization technologies and, more specifically, to a plasma polymerization coating apparatus and process.

TECHNICAL BACKGROUND

The plasma polymerization coating treatment is an important surface treatment technique because of its advantages over other conventional techniques. For example, in plasma polymerization coating, polymers can be directly attached to a desired surface where molecular chains grow. This reduces the overall number of steps necessary for coating the surface to be treated. Other advantages include the availability of a wider selection of monomers, as compared to conventional chemical polymerization techniques.

However, due to various shortcomings in existing designs of conventional plasma coating equipment, conventional plasma polymerization treatment often suffers from production limitations, resulting in small batch size, low efficiency, high cost, and poor batch uniformity.

BRIEF DESCRIPTION OF DRAWINGS

One or more embodiments of the present disclosure are illustrated by way of example and not limitation in the figures of the accompanying drawings, in which like references indicate similar elements. These drawings are not necessarily drawn to scale.

DETAILED DESCRIPTION

Certain specific embodiments of the present disclosure will be described in detail below in reference to the related technical solutions and accompanying drawings. In the following description, numerous specific details are set forth to provide a thorough understanding of the presently disclosed technology. In other embodiments, the techniques described here can be practiced without these specific details. In other instances, well-known features, such as specific fabrication techniques, are not described in detail in order to avoid unnecessarily obscuring the present technology. References in this description to "an embodiment," "one embodiment," or the like mean that a particular feature, structure, material, or characteristic being described is included in at least one embodiment of the present disclosure. Thus, the instances of such phrases in this specification do not necessarily all refer to the same embodiment. On the other hand, such references are not necessarily mutually exclusive. Furthermore, the particular features, structures, materials, or characteristics can be combined in any suitable manner in one or more embodiments. Also, it is to be understood that the various embodiments shown in the figures are merely illustrative representations and are not necessarily drawn to scale.

As previously mentioned, plasma polymerization coating is capable of producing results with highly desirable characteristics and can perform well in certain applications, such as hydrophobic film coating. However, since the polymer coating tends to be very thin, it can be difficult to achieve the desired uniformity of the coating.

To perform plasma polymerization coating, a substrate to be treated can be first placed in a vacuum chamber, and then carrier gas and gaseous organic monomer are dispersed into the vacuum chamber. The gaseous organic monomer is turned into a plasma state by discharging electrical power to the monomer to produce various types of reactive species. Next, additional reactions between the reactive species and the monomer, or between the reactive species themselves, take place and form a polymer film on the substrate's surface. In certain applications such as hydrophobic or oleophobic film coating, plasma polymerization coating is capable of producing results with highly desirable characteristics.

Conventional plasma coating devices are typically equipped with a rectangular vacuum chamber, and as a result, during the coating process, the positions of the substrate-carrying platforms and the substrate placed thereon are typically fixed within the conventional vacuum chamber. Because different substrates in the same batch are in different positions in the vacuum chamber, they are at varying distances from the electrodes, monomer/carrier gas outlet, vacuum gas outlet, etc. Accordingly, it is inevitable that the thickness of the coats applied to each substrate vary based on the different locations of each substrate within the chamber. Hence, in order to reduce the variation in uniformity within the same batch, currently available plasma coating devices typically adopt a vacuum chamber with a small volume and are treated in small-quantity batches. This method greatly reduces processing efficiency and increases the cost. Even so, it may still not produce a satisfactory batch uniformity that meets a client's requirement. With the rapid expansion of polymer coating applications, demands for such processing are increasing rapidly.

Accordingly, disclosed here are plasma coating apparatus and techniques that address the technical problems in the existing plasma coating processes, such as small batch size, low efficiency, high cost, and poor batch uniformity.

In the following description, numerous specific details are set forth such as examples of specific components, circuits, and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure.

The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication (e.g., a network) between components. The present embodiments are not to be construed as limited to specific examples described herein but rather to include within their scope all embodiments defined by the appended claims.

Plasma Polymerization Coating Apparatus

Figure 1:
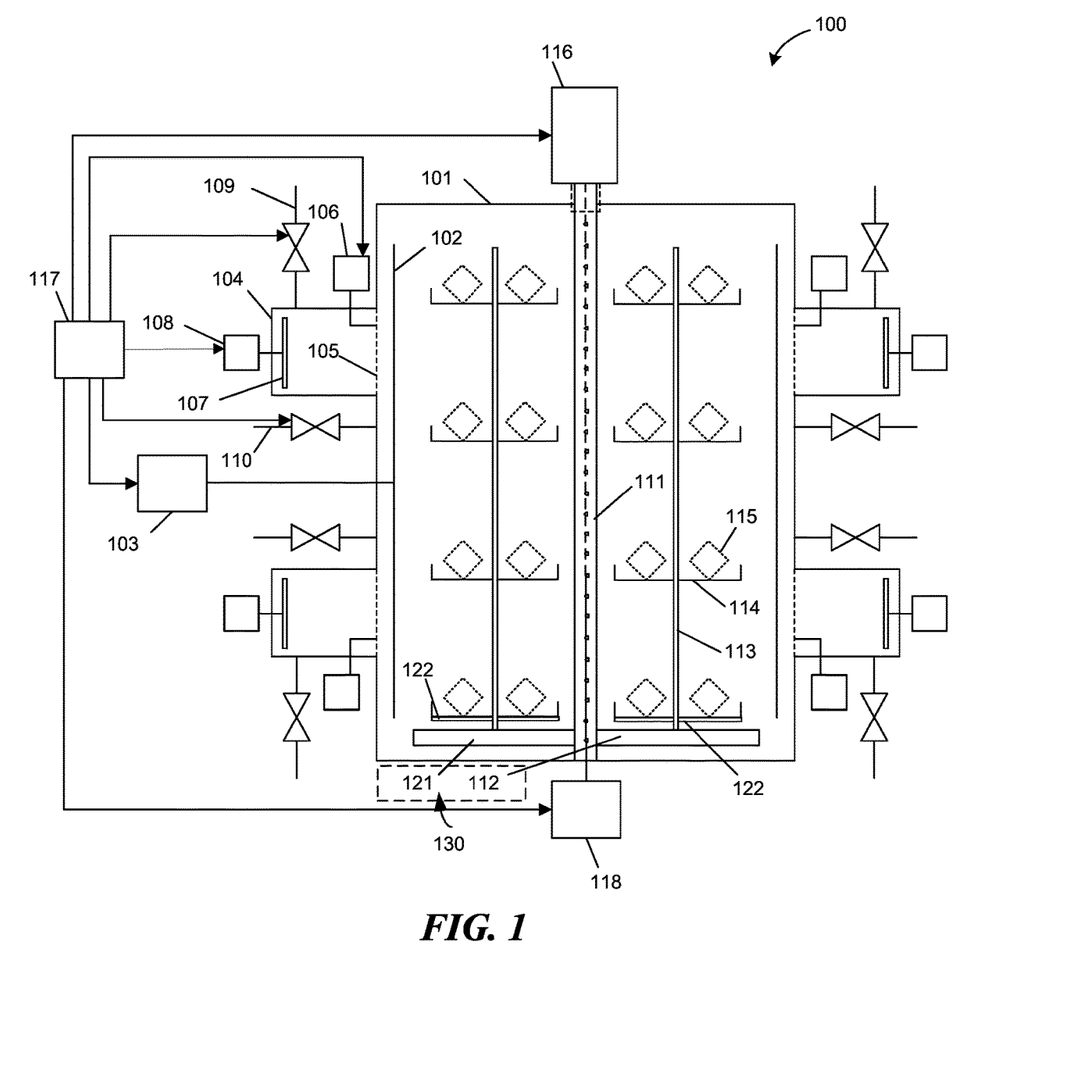
FIG. 1 is a schematic front sectional view of the structure of an example plasma polymerization coating apparatus with planetary rotation axles arranged on the rotation rack, according to one or more embodiments of the present disclosure.
Figure 2:
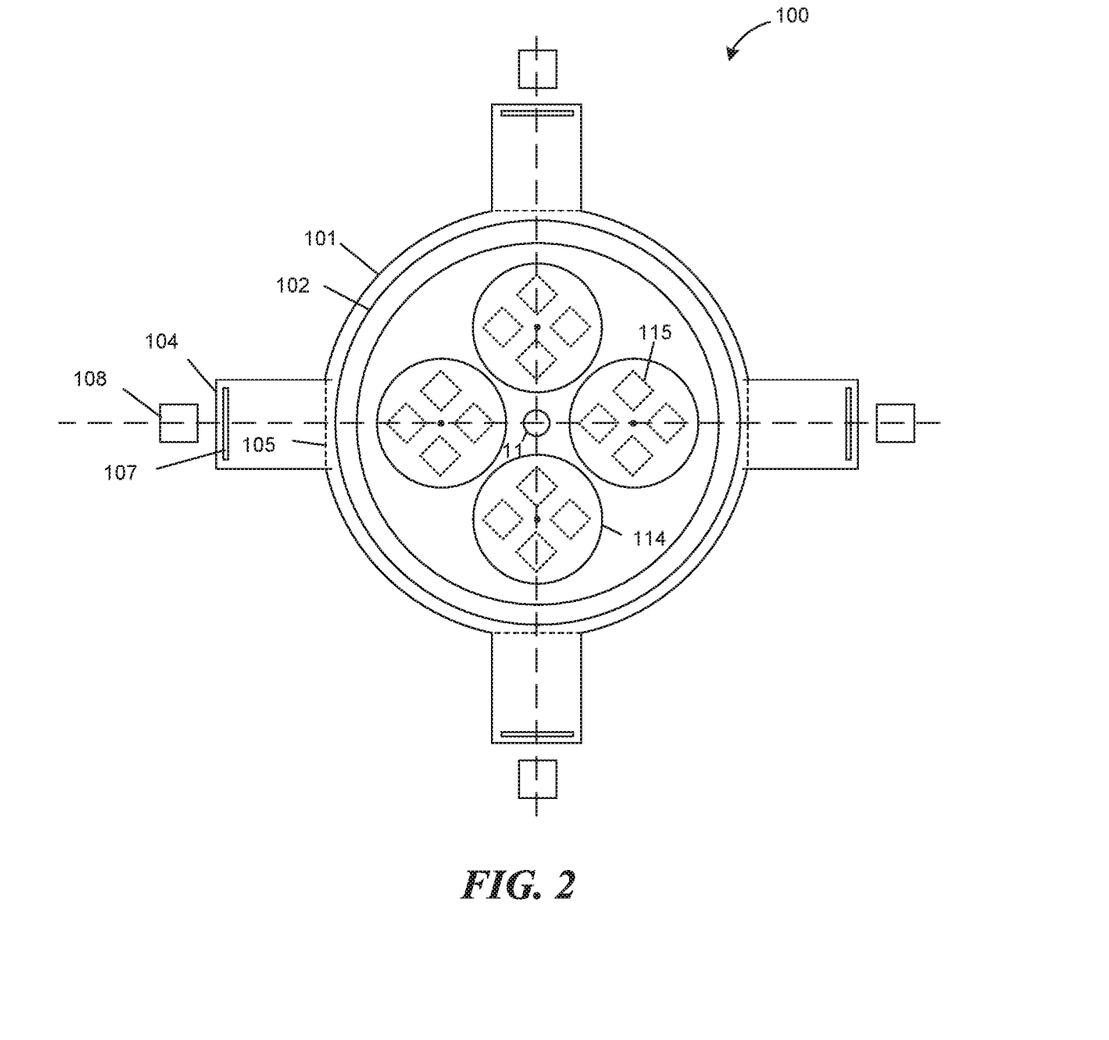
FIG. 2 is a schematic top view of the structure of the example apparatus shown in FIG. 1, according to one or more embodiments of the present disclosure.

Shown in FIGS. 1 and 2 is a plasma polymerization coating device 100 according to one or more embodiments of the present disclosure for applying a plasma polymerization coating to substrates 115. In an example embodiment, the plasma polymerization coating apparatus includes vacuum chamber 101, porous electrode 102, radio frequency power source 103, discharge cavity 104, metal grid 105, pulse power source 106, discharge source 107, discharge power source 108, carrier gas pipe 109, monomer vapor pipe 110, tail gas collecting tube 111, rotation racks 130, 122, planetary rotation shafts 113, planetary rotation platforms 114, substrates 115 to be treated, vacuum pump 116, controller 117, and rotary motor 118.

Vacuum Chamber

Vacuum chamber 101 functions as a container where polymerized plasma may be applied to substrates 115. For purposes of the present disclosure, the term "vacuum chamber" means a chamber having a lower gas pressure than what is outside of the chamber (e.g., as a result of having vacuum pump 116 pumping gas out of the chamber); the term does not necessarily mean that the chamber is exhausted to a vacuum state. For the purposes of discussion herein, vacuum chamber 101 may also be referred to as a "reaction chamber;" it is a chamber where one or more chemical reactions described herein (e.g., for implementing the disclosed plasma coating techniques) take place. In some examples, during the coating process, vacuum chamber 101 can be first exhausted of gas to a base pressure around 5 mTorr and then filled with the carrier gas. After filling vacuum chamber 101 with carrier gas, the air pressure in the vacuum chamber 101 may rise to around tens of mTorr. The volume of vacuum chamber 101 may vary depending on the application, for example, between 50-3000 liters. Examples of the chamber material may include aluminum alloy or stainless steel.

Vacuum chamber 101 has a chamber body inner wall along the perimeter of vacuum chamber 101. The inner wall of vacuum chamber 101 may be characterized by a circular top view cross section with the same diameter as other top view cross sections, or a polygon with the same edge length as other top view cross sections. Some embodiments of said polygon have at least six edges.

The top cover and the bottom cover of vacuum chamber 101 may be a flat plate or an arched structure, such as a spherical segment, a regular polygon, or an oval. In some embodiments, the structure matches the top view cross section of the chamber body inner wall of vacuum chamber 101.

Porous Electrodes

In some embodiments, porous electrode 102 can generate plasma for pre-treating the surface of the substrate to be coated by polymerization in subsequent steps. In particular, high electricity power (e.g., over 600 watts) are continuously discharged through porous electrode 102 to produce a strong plasma. The resulting plasma can be used for at least two purposes: (1) cleaning organic impurities on the substrate surface, such as water and oil stains, as well as (2) activating organic substrate to form dangling bonds to facilitate coating deposition and enhance the binding force between the substrate and the coating. In some embodiments, this surface plasma pre-treatment via porous electrode 102 is optional.

In some embodiments, the porous electrode 102 may form a cylindrical shape or at least divided into two sections of cylindrical shape, and the porous electrode 102 can be coaxial with the vacuum chamber 101. The porous electrode 102 can be covered by holes, and the size of a hole can range between 2 to 30 mm. The space between holes can range from 2 to 30 mm.

Porous electrode 102 is installed in vacuum chamber 101 near or proximal to the inner wall of vacuum chamber 101. Porous electrode 102 form a porous arched structure within a distance from the inner wall of vacuum chamber 101. In some embodiments, the distance from porous electrode 102 to the inner wall of vacuum chamber 101 can range between 1 to 6 cm.

The reaction chamber of the plasma polymerization coating apparatus includes a radio frequency power supply coupled to a porous electrode. In some embodiments, the radio frequency power supply is configured to provide an electrical charge to the porous electrodes to produce a treatment plasma to remove impurities from the surface of the one or more substrates. The radio frequency power supply can be coupled to the controller to receive a radio frequency control signal that controls the power output to the porous electrodes.

For example, porous electrode 102 may be connected with a radio frequency (e.g., high frequency) power source 103. When power from radio frequency power source 103 is applied to porous electrode 102, plasma is generated for removing impurities from the surface of substrates 115. The power of radio frequency power source 103 may be configured to be between 15-1500 watts. Note that, in some embodiments, the plasma generated during power discharge can be used for substrate surface cleaning and pretreatment. According to some embodiments, the gas that is used to produce plasma for cleaning (e.g., pretreating the surface of the substrate) contains oxygen.

As mentioned above, radio frequency power source 103 is applied to porous electrode 102 to generate a plasma for removing impurities from the surface of substrates 115. In one or more embodiments, radio frequency power source 103 is used for driving the electrical discharge even when and if the electrodes are covered by dielectric coatings; in comparison, direct current (DC) power sources or low frequency power sources (e.g., under 50 Hz) do not have this advantage. The applicable high frequency may range from tens of kHz to several GHz. Typical high frequencies include 40 kHz, 13.56 MHz and 2.45 GHz, etc. The choice of the frequency may depend on the technical requirement or specification, the existing products' material characteristics, and the cost. It is noted that a person having ordinary skill in the art of dielectric coating should be able to select a suitably high frequency to perform the coating of a specific material.

Additionally, because electrodes of radio frequency power source 103 alternates in polarity, the electrodes are identified as the driving electrodes and the grounding electrodes instead of the cathode and anode electrodes. In one or more embodiments of the disclosed apparatus, porous electrode 102, which connects to the output of the radio frequency power source 103, is the driving electrode. In at least some of these embodiments, the wall of vacuum chamber 101 can act as the grounding electrode. Additionally, or alternatively, tail gas collecting tube 111 can also act as the grounding electrode.

Discharge Cavity

The reaction chamber of the plasma polymerization coating apparatus includes a dispersal mechanism positioned around a perimeter of the reaction chamber. In some embodiments, the reaction chamber is configured to disperse reactive species into the reaction chamber in a substantially even manner. The dispersal mechanism can be configured to disperse reactive species toward the central axis of the reaction chamber, such that the reactive species form a polymeric coating on surfaces of the one or more substrates. The dispersal mechanism includes a discharge cavity 104 and a metal grid 105 configured to create a pressure differential between the discharge cavity and the reaction chamber. The metal grid 105 may also be configured to reduce or prevent gas backflow from the reaction chamber to the discharge cavity.

Discharge cavity 104 is connected to vacuum chamber 101. Discharge cavity 104 includes discharge source 107 coupled to a discharge power source 108 to produce plasma for polymerization. One end of discharge source 107 can be connected to a discharge power source 108 and with a carrier gas pipe 109. The other end of the carrier gas pipe 109 is connected to a carrier gas source. Monomer vapor pipe 110 can be connected to vacuum chamber 101, and an outlet thereof can be located in front of discharge cavity 104. The other end of monomer vapor pipe 110 can be connected to a monomer vapor source.

In some embodiments, discharge cavity 104 may form a cylindrical shape, and can be made from materials including, for example, aluminum, carbon steel, or stainless-steel material. The diameter of discharge cavity 104 can range from 5 to 20 cm, the depth from 3 to 15 cm, and the distance between two neighboring discharge cavities from 7 to 40 cm. The axes of discharge cavity 104 may be orthogonal to the axis of the vacuum chamber 101 to provide the largest opening area to the plasma to travel to the vacuum chamber 101. In alternate embodiments, under the pressure of several Pascal in the process, free diffusion dominates the plasma propagation, so the orientation of the discharge cavity has little importance.

No specific requirement for the size ratio between the discharge cavity and the vacuum chamber; rather, it is determined by practice. For example, a single, relatively large discharge cavity 104 allows for dispersal of a greater volume of carrier gas-based plasma. However, a single discharge cavity provides for carrier gas-based plasma from a single direction into the vacuum chamber 101 and thus does not provide adequate uniformity of the polymerization coating. Conversely, the number and distribution of the discharge cavities is determined by the desired coating uniformity. Smaller discharge cavities 104 that are uniformly distributed provide greater uniformity of the applied coating. However, too many small discharge cavities present technical limitations and increased costs. The final design should be optimized to provide a balance of uniformity, technical limitations, and cost.

Discharge cavity 104 is provided with carrier gas pipe 109 that injects carrier gas. The carrier gas gets ionized in discharge cavity 104 and becomes plasma (i.e., a mixture of positive ions and electrons produced by ionization). The carrier gas transfers energy to the monomer vapor to activate the monomer vapor to a high-energy state (i.e., the monomer vapor become activated species). In some embodiments, the carrier gas may even cause some chemical bonds of the monomer to break and form reactive particles such as free radicals.

When the carrier gas encounters an electrical discharge from discharge power source 108 at discharge source 107, the carrier gas form a plasma. During the coating process, discharge cavity 104 discharge at a relatively low power to generate weak plasma. The weak plasma is intermittently released into vacuum chamber 101 by metal grid 105 to initiate monomer polymerization and deposition on the surface of the substrate to form a polymerization coating. Depending on the embodiment, discharge source 107 can be a lamp filament, an electrode, an induction coil, or a microwave antenna. Discharge source 107 can have discharge power ranging from 2 to 500 W.

Depending on the embodiment, the porous electrode 102 and discharge cavity 104 are independent of each other, and they can be operated either together or separately. In some embodiments, during the polymeric coating process, the porous electrode 102 is used for (1) pre-treatment of the samples and (2) post-cleaning of the chamber. That is to say, in these embodiments, the porous electrode 102 do not operate during coating process. On the other hand, according to one or more embodiments, discharge cavity 104 is mainly used for coating. Additionally, or alternatively, discharge cavity 104 can also be used for post-cleaning of the cavities themselves.

For purposes of the disclosure here, the term "strong plasma" is associated with higher power relative to the plasma and discharge power of discharge cavity 104. The typical discharge power for strong plasma can be several hundred watts, and the plasma density is between $10^9$-$10^{10}$/$cm^3$. The term "weak plasma" with lower power relative to the plasma and discharge power of the porous electrode 102. Typical discharge power for weak plasma can be several watts to tens of watts, and the plasma density is between $10^7$-$10^8$/$cm^3$. Example materials for the monomer containing acrylate, such as ethoxylated trimethylolpropane triacrylate, or perfluorocyclohexyl methyl acrylate.

Metal Grid

Under a general vacuum condition, a pressure gradient may exist along the way from the gas inlet to the exhaust exit, even if no mesh exists. This can be measured by vacuum meters at different positions of the vacuum chamber 101. Therefore, the strategic placement of the metal grid 105, such as introduced here, can increase the pressure difference between discharge cavity 104 and the main vacuum chamber 101 by hindering the carrier gas flow. Generally speaking, the pressure difference may increase with the number of layers, the mesh number, and transmissivity of the grid. In some embodiments, each layer may have different characteristics. For example, one layer may have smaller openings while another layer has larger openings. Additionally, there may be a preferred order for the gates (e.g., the carrier gas-based plasma moves through a gate with larger openings before moving through a gate with smaller openings).

In some embodiments, the number of layers of metal grid 105 can range from 2 to 6. Metal grid 105 can be made of materials including, for example, stainless steel or nickel. Metal grid 105 ranges from 100 to 1,000 mesh, and the transmissivity can range from 25% to 40%. Metal grid 105 increases the pressure differential to reduce or to prevent backflow of carrier gas from vacuum chamber 101 to discharge cavity 104. In some embodiments, at least two layers of metal grid 105 are provided at the connecting positions of the discharge cavities and the inner walls of vacuum chamber 101. Metal grid 105 is insulated from the inner wall of vacuum chamber 101.

Metal grid 105 is arranged at the connecting positions of the discharge cavities and the inner walls of vacuum chamber 101. In some embodiments, at least two discharge cavities 104 are provided on an outer wall of the vacuum chamber 101 in a sealed manner. In some examples, the porous electrode 102 and the discharge cavities are able to discharge together or separately according to the needs of the specific processes.

In one or more embodiments, a pulse power source 106 is coupled to the metal grid 105. The pulse power source 106 can be configured to provide a positive electrical charge to the metal grid 105 in pulses, wherein plasma in the discharge cavity is blocked from entering the reaction chamber during a pulse-off period. The plasma in the discharge cavity can be passed through to the reaction chamber during a pulse-on period.

As a result, when power is applied, the plasma generated in discharge cavity 104 is released into vacuum chamber 101. For example, the plasma is blocked (at least partially) by metal grid 105 within discharge cavity 104 during a period of pulse-off (i.e., when no power is applied to metal grid 105), and the plasma can pass through metal grid 105 during a period of pulse-on (i.e., when power is applied to metal grid 105) into vacuum chamber 101. In some embodiments, pulse power source 106 outputs a positive pulse with the following parameters: peak is from 20 to 140 V, pulse width is from 2 µs to 1 ms, and repeat frequency is from 20 Hz to 10 kHz.

Similarly, the metal grid 105 can place a hindering effect on the reverse-diffusion of the monomer vapor from the vacuum chamber 101 to discharge cavity 104. Moreover, since the pressure in the discharge cavity 104 can be higher than that in the vacuum chamber 101, the monomer vapor may not easily move from the vacuum chamber 101 to the discharge cavity 104 through reverse-diffusion, thereby preventing the monomer vapor from being excessively decomposed and destructed by the continuously discharged plasma in the discharge cavity 104. In some embodiments, the metal grid 105 can help create a pressure differential, so as to reduce or to prevent the carrier gas from backflowing.

Monomer Vapor Pipe

Monomer vapor pipe 110 can be connected to vacuum chamber 101, and an outlet can be located adjacent to discharge cavity 104. The other end of monomer vapor pipe 110 is connected to a monomer vapor source. The distance between the outlet of monomer vapor pipe 110 and discharge cavity 104 can range from 1 to 10 cm. In one embodiment, the monomer vapor pipe 110 is directly connected to vacuum chamber 101 rather than within discharge cavity 104. This is to avoid the monomer vapor from being exposed to strong electrical charges from the discharge cavity 104.

In some embodiments, the monomer vapor is not discharged by the porous electrode 102; in these embodiments, the porous electrode 102 may be designed to only operate during the pre-treatment period when no monomer vapor is fed in into vacuum chamber 101. However, during the coating period, the monomer vapor may be partly discharged in and out of discharge cavity 104. Discharge of the monomer vapor may be undesirable because it may lead to excess breakdown of the monomer molecules. Thus, the monomer vapor pipe 110 is designed directly connected to vacuum chamber 101 to avoid the monomer vapor from being strongly discharged in discharge cavity 104 when passing through it. Rather, the carrier gas-based plasma is intermittently released from the discharge cavities to activate the monomer vapor with minimized discharge of it.

Tail Gas Collecting Tube

The reaction chamber of the plasma polymerization coating apparatus includes a collecting tube positioned along the central axis of the reaction chamber. In some embodiments, the reaction chamber is operable to have an air pressure lower than the reaction chamber to collect excess reactive species in the atmosphere of the reaction chamber at a controlled exhaust rate. For example, in some embodiments, tail gas collecting tube 111 is vertically positioned through the center of vacuum chamber 101. One end of the tail gas collection tube 111 is connected to vacuum pump 116 and holes are distributed along the wall of tail gas collection tube 111. Gas and plasma in vacuum chamber 101 enters the tail gas collection tube 111 via the holes on the tail gas collection tube 111, and then is discharged from vacuum chamber 101 tube 111 by vacuum pump 116. The power of vacuum pump 116 may range between 3-50 kW, and the pumping rate may range between 600-1200 $m^3/h$. The inner diameter of tail gas collecting tube 111 can range from 25 to 100 mm. In some embodiments, holes can be evenly provided on the wall of tail gas collecting tube 111. The hole size can range from 2 to 30 mm, and the space between holes can range from 2 to 100 mm.

Rotation Rack

The reaction chamber of the plasma polymerization coating apparatus includes a primary rotation rack 130 operably coupled to a primary rotation shaft and configured to rotate along a central axis. The primary rotation rack 130 includes one or more arms 112, 121 extending from the primary rotation shaft and away from the central axis. The primary rotation rack 130 may include one or more rack layer, each rack layer holding a plurality of substrate platforms from the one or more substrate platforms.

The primary rotation rack 130 may include rotation arms 112, 121 for moving a substrate to be treated within vacuum chamber 101. The primary rotation rack 130 may be coaxial with the central axis of vacuum chamber 101 and rotate along the central axis using a rotary motor 118. The power of rotary motor 118 may be between 30-3000 W. In some embodiments, the primary rotation shaft may be coupled or otherwise integrated with tail gas collection tube 111. In yet other embodiments, the tail gas collection tube in may also function as the primary rotation shaft.

The reaction chamber of the plasma polymerization coating apparatus also includes a secondary rotation rack 122 operably coupled to a secondary rotation shaft. The reaction chamber is configured to rotate on a secondary axis that is distal from the central axis, wherein the secondary rotation shaft is coupled to an arm of the one or more arms extending from the primary rotation shaft. The rotation of the primary rotation rack 130 along the central axis and the rotation of the secondary rotation rack 122 along the secondary axis can provide the same rate of spatial movement for each of the one or more substrates during the coating process in order to achieve uniform coating.

The secondary rotation rack can be coupled to the planetary rotary shafts 113 that is secured on rotation arm 112. The planetary rotary shafts 113 may support planetary rotation platform 114 that rotate along a secondary axis which is coaxial with planetary rotary shafts 113. Additionally, the planetary rotary shafts 113 may be distal to the central axis of vacuum chamber 101. In some embodiments, the number of the planetary rotary shafts 113 may be between 2 to 8, and the number of the planetary rotation platforms 114 may be between 1 to 10.

The reaction chamber of the plasma polymerization coating apparatus also includes one or more substrate platforms configured to carry the one or more substrates that are to receive the plasma polymerization coating. Each substrate platform can be located on the secondary rotation rack 122. The substrate platforms may be planetary rotation platforms 114. Planetary rotation platforms 114 allow for placement of substrates 115 to be treated such that the substrates 115 are in continuous movement along vacuum chamber 101. The planetary rotation platforms 114 are secured along planetary rotary shafts 113, wherein each planetary rotation platforms 114 rotates around their own planetary rotation axes while the planetary rotation axes rotate around the central axis of vacuum chamber 101. The continuous movement allows for uniform plasma polymerization treatment on the surface of substrates 115.

Note that, even though there is no particular directional requirement for the rotation of planetary rotation shafts 113 versus the rotation of the primary rotation rack 130, overall the rotations should be suitably tuned and adjusted (e.g., for the sake of rotational balance and stability) such that substantially all samples can experience the same spatial movement during the coating process in order to achieve uniform coating. Similarly, there is no particular limitation on the rotational speed; however, it is apparent that an overly fast rotational speed is unfavorable because of the unnecessary power consumption, part wear, as well as instability of the platform.

Polymerization Controller

The reaction chamber of the plasma polymerization coating apparatus also includes a controller configured to transmit a rotation rate control signal to a rotation motor to rotate the primary rotation shaft and primary rotation rack 130 at a controlled rotation rate. The controller may be implemented as controller 117 for providing control signals to various components of the planetary rotary rack device. Such control signals allow the device to regulate the plasma polymerization process applied to substrates 115.

Controller 117 may transmit a rotation rate signal to rotary motor 118. The rotation rate signal indicates the rotational speed that rotary motor 118 should operate. Regulating the rotational speed may determine the rate that substrates 115 traverse vacuum chamber 101. For example, a faster rotational speed may allow the substrate to traverse vacuum chamber 101 relatively quickly. Therefore, any imbalance of the concentration of plasma in the vacuum chamber 101 would be negated because substrates 115 would be rapidly exposed to both ends of the plasma concentration gradient.

The dispersal mechanism is communicatively coupled to the controller 117 to receive a dispersal control signal from the controller to control the dispersal rate of the reactive species in a substantially even manner on the one or more substrates. The dispersal control signal controls the dispersal rate of the reactive species by regulating the applied electrical power to the dispersal mechanism and/or by regulating the rate of gas that enters the dispersal mechanism for polymerization. In some embodiments, the dispersal rate control signal adjusts the dispersal rate to account for the density decrease in the reactive species within the reaction chamber resulting from the deposition of the reactive species on to the one or more substrates and the density increase within the reactive species in the reaction chamber resulting from the reactive species converging toward the center of the chamber such that the density of reactive species across the reaction chamber is uniform.

Specifically, controller 117 may transmit a dispersal control signal to discharge power source 108 to indicate the power that should be applied to discharge source 107. Regulating the power applied to discharge source 107 allows for control of the rate in which plasma is generated in discharge cavity 104. Therefore, a change in the power to discharge source 107 may affect a change in the density of plasma as well as the properties of the plasma in vacuum chamber 101 and ultimately the thickness of the plasma applied to substrates 115.

In some embodiments, the pulse power source receives a pulse control signal from the controller, the pulse control signal regulating the power and frequency of the positive electrical charge. Specifically, controller 117 may transmit a pulse control signal to pulse power source 106. The pulse control signal indicates the power to be applied by pulse power source 106 to metal grid 105. Specifically, pulse power source 106 applies a positive electrical pulse bias on metal grid 105, thus allowing the plasma generated in discharge cavity 104 to be intermittently released into vacuum chamber 101. For example, the plasma can be blocked by metal grid 105 within the discharge cavity 104 during a period of pulse-off, and the plasma can pass through metal grid 105 during a period of pulse-on into the vacuum chamber 101. Using this mechanism, the pulse control signal controls the duration and frequency in which plasma is allowed to enter from discharge cavity 104 to vacuum chamber 101.

Controller 117 may transmit a radio frequency power control signal to radio frequency power source 103. The radio frequency power signal indicates to radio frequency power source 103 when to apply power to porous electrode 102 to generate plasma for removing impurities from substrates 115. For example, controller 117 may transmit a radio frequency power control signal to power on radio frequency power source 103 at the start of a plasma polymerization process to pre-treat substrates 115 or after the plasma has been applied to the substrate for post-treatment of substrates 115 and vacuum chamber 101.

Controller 117 also transmits various control signals for regulating the introduction and evacuation of gases into the planetary rotary rack device. For example, controller 117 transmits a carrier gas control signal to carrier gas pipe 109. This control signal indicates the rate in which carrier gases should be introduced into discharge cavity 104. Controller 117 also transmits a monomer vapor control signal to monomer vapor pipe 110. The monomer vapor control signal indicates the rate in which monomer vapor gases are introduced into vacuum chamber 101.

In some embodiments, a collecting tube is communicatively coupled the controller to receive an exhaust rate control signal from the controller to control the exhaust rate of the reactive species. For example, controller 117 provides a tail gas control signal to tail gas collection tube 111. This signal controls the rate in which the atmosphere is evacuated from vacuum chamber 101. In some embodiments, the controller transmits the exhaust rate control signal to adjust the rate the reactive species is exhausted from the reaction chamber. The exhaust rate is controlled to account for two factors contributing to the density of the reactive species within the reaction chamber: (1) the density decrease in the reactive species within the reaction chamber resulting from the deposition of the reactive species on to the one or more substrates and (2) the density increase within the reactive species in the reaction chamber resulting from the reactive species converging toward the center of the chamber such that the density of reactive species across the reaction chamber is uniform.

Controller 117 may be microcontrollers, general-purpose processors, or may be application-specific integrated circuitry that provides arithmetic and control functions to implement the techniques disclosed herein. The processor(s) may include a cache memory (not shown for simplicity) as well as other memories (e.g., a main memory, and/or non-volatile memory such as a hard-disk drive or solid-state drive. In some examples, cache memory is implemented using SRAM, main memory is implemented using DRAM, and non-volatile memory is implemented using Flash memory or one or more magnetic disk drives. According to some embodiments, the memories may include one or more memory chips or modules, and the processor(s) on Controller 117 may execute a plurality of instructions or program codes that are stored in its memory.

FIG. 2 is a schematic top view of the structure of the plasma polymerization coating device 100 shown in FIG. 1, according to one or more embodiments of the present disclosure.

Overall, the present disclosure has various beneficial effects. First, the device employs a central axis symmetrical vacuum chamber 101 structure to maintain the uniformity of space polymerization reactive material density. The vacuum chamber 101 adopts a mechanism in which the gas is fed via the side wall, transported radially, and discharged along the direction of central axis.

In one or more embodiments, the carrier gas pipe 109 is provided in each discharge cavity 104 and with an outlet. A carrier gas can enter the discharge cavities via carrier gas pipe 109, and then diffuse into the vacuum chamber 101 via the multilayer metal grid 105. The monomer vapor pipe 110 is provided with an outlet in front of discharge cavity 104 in the vacuum chamber 101. A monomer vapor gas enters the vacuum chamber 101 via monomer vapor pipe 110. In addition, a tail gas collection tube 111 is coaxially provided the vacuum chamber 101 along the axis of the vacuum chamber 101. The tail gas collection tube vertically penetrates through the vacuum chamber 101. One end of the tail gas collection tube 111 is connected to vacuum pump 116, and holes are evenly distributed on the wall of the tube. A tail gas enters the tail gas collection tube via the holes on the tail gas collection tube, and then is discharged from the vacuum chamber 101 by vacuum pump 116.

In the foregoing approach, in which the gas is fed via the side wall, transported radially, and discharged along the direction of central axis, the gas transport process takes place in a convergent manner, which can facilitate an increased stability of reactive species concentration in the space polymerization reaction, and a more evenly distribution of reactive species. In one embodiment, the process starts by generating polymerization reaction reactive species when the monomer vapor comes into contact with the carrier gas-based plasma in the vicinity of discharge cavity 104. Activated by the carrier gas, the generated polymerization reactive species are radially dispersed towards the axis of the vacuum chamber 101. As substrates 115 are rotated within vacuum chamber 101, the amount of the polymerization reaction reactive species gradually decreases due to continuous consumption. Simultaneously, the polymerization reaction reactive species also gradually converge, which can compensate for the foregoing decrease in the amount of the polymerization reaction reactive species. In this way, the concentration of the polymerization reaction reactive species can remain stable. The bulk density of the reactive species in the vacuum chamber 101 can remain unchanged, and thus the batch treatment can enjoy good uniformity.

In other words, the reactive species discharge mechanisms and the collecting tube can be collectively configured in a way such that, a density decrease in the reactive species due to consumption of the reactive species can be substantially equal to a density increase in the reactive species due to the reactive species converging toward the collecting tube. Therefore, the coordinated operation of the reactive specifies discharge mechanism and tail gas collecting tube 111 can provide uniform density of the reactive species across vacuum chamber 101 and onto substrates 115. Specifically, in some implementations, a discharge rate of the discharge mechanism can be adjusted (e.g., via controlling the applied electrical power and/or an amount of gas) together with an exhaust rate of the collecting tube (e.g., via adjusting the power of vacuum pump) such that a substantially uniform density of the reactive species across the vacuum chamber 101 can be achieved. In many embodiments, the aforesaid collective adjustment of the discharge mechanism and the collecting tube corresponds to the shape of the cross section of the inner side wall of a given vacuum chamber 101. That is to say, in these embodiments, the combination of the discharge rate of the discharge mechanism and the exhaust rate of the collecting tube is preferably tailored to match the particular shape (e.g., a circle, or a polygon) of the given vacuum chamber 101 so as to achieve the substantially uniform density of the reactive species.

As compared to conventional coating devices and technology, the difference in substrate coating thickness of the same batch treatment in the conventional coating devices can be greater than 30%, while the difference in substrate coating thickness of the same batch treatment in the disclosed devices can be smaller than 10%.

Second, the device also employs a secondary rotation rack 122 positioned on an arm 112 to significantly improve the uniformity of each substrate coating. In one or more embodiments, the vacuum chamber 101 is provided with the secondary rotation rack 122. The substrate platforms 114 on the secondary rotation rack 122 are able to rotate or make planetary rotation movement in the vacuum chamber 101. In particular, the disclosed planetary rotary movement mechanism provides that the substrate platforms 114 each rotate around their own planetary rotation axes while making a coaxial revolutionary movement along the substrate platform and around the central axis of the vacuum chamber 101. A substrate to be treated can be placed on a substrate platform. The introduced planetary rotary movement allows the spatial position and orientation of each substrate treated to change continuously during the process of the treatment, such that all of the spatial positions of different substrates in the process of coating treatment can be substantially the same, thereby eliminating the difference in coating due to different spatial positions of different substrates in the existing technology. In this way, the treatments of different substrate become the same, and accordingly, the introduced techniques may achieve the same coating effects and better uniformity for substrates of different locations in the same batch.

Third, the device is able to greatly increase the volume of the vacuum chamber 101, and significantly improve the treatment efficiency. Due to the improvements in the structures of vacuum chamber 101 and the secondary rotation rack 122, coating film thickness uniformity can be greatly improved for the treatment in the same batch. In addition, the vacuum chamber 101 volume can be expanded by 5 to 6 times. Accordingly, the batch treatment quantity and treatment efficiency have been greatly increased.

Third, the device is able to greatly increase the volume of the vacuum chamber 101, and significantly improve the treatment efficiency. Due to the improvements in the structures of vacuum chamber 101 and rotation rack 112, coating film thickness uniformity can be greatly improved for the treatment in the same batch. In addition, the vacuum chamber 101 volume can be expanded by 5 to 6 times. Accordingly, the batch treatment quantity and treatment efficiency have been greatly increased.

In conclusion, the device according to the present disclosure can effectively protect the monomer vapor from being decomposed and destructed so as to obtain a polymer coating of very good quality.

Plasma Polymerization Coating Method

One aspect of the techniques disclosed herein includes a reactive species discharge method. In one embodiment, the method begins by positioning a substrate on a substrate platform located in a reaction chamber. The atmosphere of the reaction chamber is evacuated by a vacuum pump via an air exhaust port of a collecting tube positioned along a central axis of the reaction chamber. The method proceeds by rotating, by a rotation motor, a primary rotation rack coupled to a primary rotation shaft. In some embodiments, the primary rotation rack is configured to rotate along the central axis. Then, a carrier gas is discharged to a discharge cavity via an inlet valve. The carrier gas can facilitate a reaction between the substrate and the reactive species. The method continues by discharging, monomer vapor into the reaction chamber using a feeding port. The method creates, the reactive species by polymerizing the monomer vapor in the reaction chamber using carrier gas. The method then deposits the reactive species onto the surface of the substrate to form a polymer coating.

Figure 3:
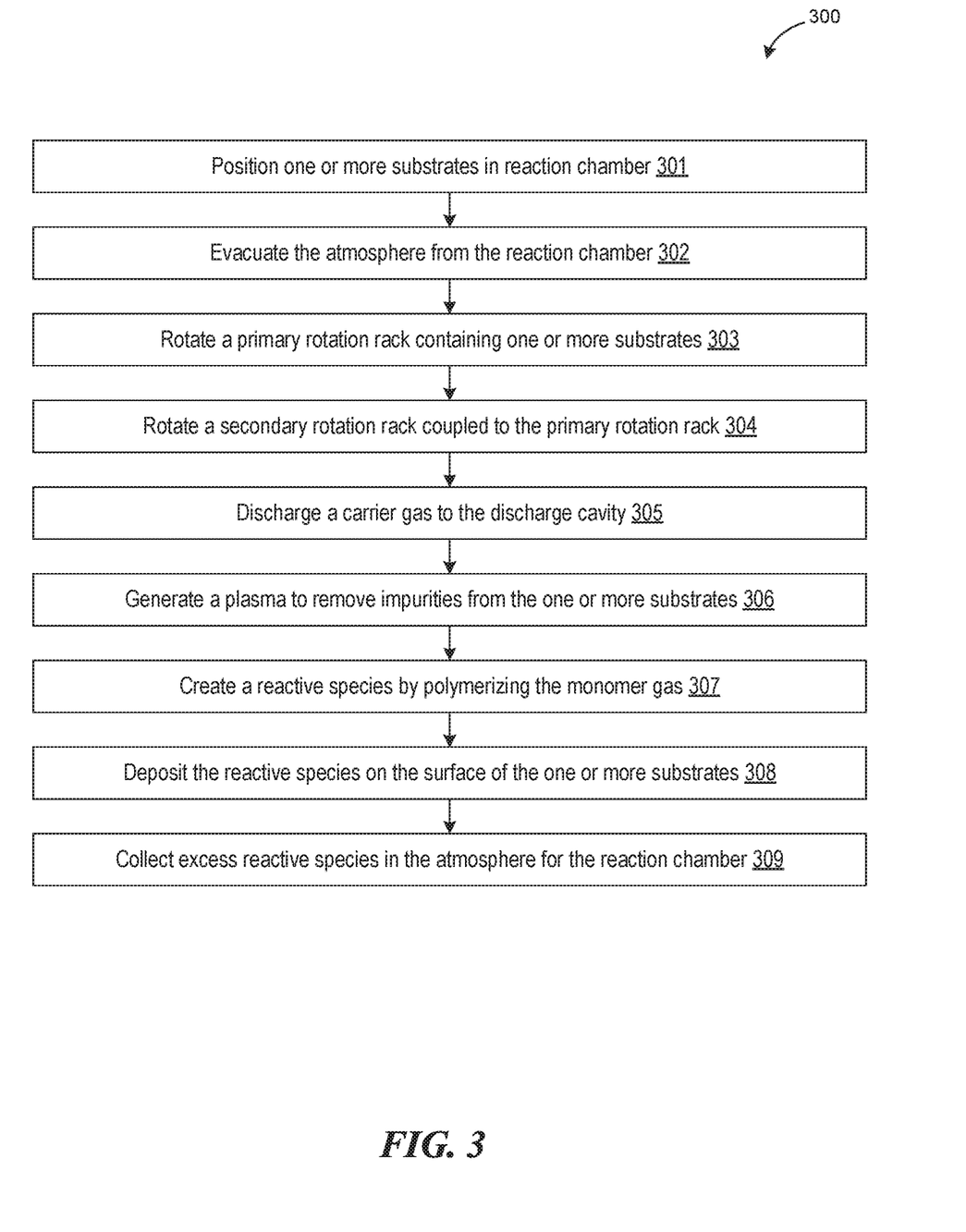
FIG. 3 is a flow diagram that illustrates a method for plasma polymerization.

FIG. 3 is a flowchart illustrating an exemplary reactive species discharge method 300. Method 300 controls and coordinates the various components of the plasma polymerization coating device 100 (e.g., controller 117, FIG. 1).

In step 301, substrates 115 are placed within the reaction chamber. In some embodiments, substrates 115 are placed on substrate platforms 114 as depicted in FIGS. 1 and 2. The placement of substrates 115 on substrate platforms 114 facilitates the movement of the substrates 115 across vacuum chamber 101 during the plasma polymerization coating process. By traveling around the different areas of the vacuum chamber 101, the negative effects of plasma density variations are reduced or eliminated to allow for a more even plasma coating on the substrate.

In step 302, controller 117 transmits control signals to vacuum pump 116 to evacuate the atmosphere within vacuum chamber 101. This process ensures that the atmosphere does not interfere with the plasma polymerization process and facilitates plasma polymerization processes that require a vacuum. In some examples, vacuum pump 116 is coupled to tail gas collecting tube 111 to create a negative atmospheric pressure in tail gas collecting tube 111 relative to the atmospheric pressure of vacuum chamber 101. The negative atmospheric pressure creates a flow of gases out of vacuum chamber 101. Controller 117 may transmit control signals to vacuum pump 116 to control the timing, power, and other operational parameters used for evacuating the atmosphere.

In step 303, the method includes the step of configuring, by a controller, the rotation rate of the rotation motor to provide the same rate of spatial movement for each of the one or more substrates during the coating process in order to achieve uniform coating. Specifically, controller 117 transmits control signals to the primary rotation rack 130 containing substrates 115 for plasma polymerization coating. Upon receiving the control signals, the primary rotation rack 130 can rotate to cause the substrates 115 to rotate within vacuum chamber 101 in accordance with various embodiments of the invention. In some embodiments, a rotation arm 112 is coupled to planetary rotation shafts 113 and substrate platforms 114 for holding substrates 115 undergoing the plasma polymerization process. The rotation motor 118 generates the rotation motion of rotation arm 112. Controller 117 may transmit control signals to rotary motor 118 that control the timing, duration, and rate of the rotation.

In step 304, the reactive species discharge method includes the step of rotating a secondary rotation rack located on an arm 112 or 121 extending from the primary rotation shaft. In some embodiments, the secondary rotation rack 122 rotates on a secondary axis different from the central axis. Specifically, controller 117 transmits control signals to planetary rotation shaft 113. The control signals cause planetary rotation shaft 113 to independently rotate along a secondary axis in accordance with various embodiments of the invention. The additional rotation provides for a wider range of movement of substrates 115 within vacuum chamber 101. This allows for additional mitigation of negative effects caused by plasma density variations by further changing the position and orientation of each substrate 115 to be treated.

In step 304, the reactive species discharge method includes the step of rotating a secondary rotation rack located on an arm extending from the primary rotation rack. In some embodiments, the secondary rotation rack rotates on a secondary axis different from the central axis. Specifically, controller 117 transmits control signals to planetary rotation shaft 113. The control signals cause planetary rotation shaft 113 to independently rotate along a secondary axis in accordance with various embodiments of the invention. The additional rotation provides for a wider range of movement of substrates 115 within vacuum chamber 101. This allows for additional mitigation of negative effects caused by plasma density variations by further changing the position and orientation of each substrate 115 to be treated.

In step 305, controller 117 transmits control signals to carrier gas pipe 109 to cause it to introduce carrier gas into discharge cavity 104 to activate the monomer vapor. When the carrier gas is introduced into discharge cavity 104, an electrical charge is applied by discharge power source 108 to discharge source 107. Due to the electrical charge, the carrier gas gets ionized in discharge cavity 104 and become plasma (i.e., a mixture of positive ions and electrons produced by ionization). In some embodiments, the carrier gas is continually introduced into discharge cavity 104 and becomes plasma throughout the polymerization process until step 309. Controller 117 may transmit control signals that control the timing and amount of carrier gas that is introduced into discharge cavity 104 as well as the timing and power applied by discharge power source 108 to discharge source 107.

In step 306, the method includes the step of generating, by an electrode coupled to a radio frequency power source, a treatment plasma to remove impurities from the surface of the one or more substrates prior to discharging the reactive species to the reaction chamber. A treatment plasma may also be generated after the reactive species is deposited on the surface of the substrate. Specifically, controller 117 transmits control signals to radio frequency power source 103 to generate an electrical charge that generates plasma in vacuum chamber 101. The plasma is generated to remove impurities from substrates 115 undergoing plasma polymerization. Additionally, the plasma may activate the surface of substrate 115 to allow binding between the surface of substrate 115 and the plasma to form the polymerization plasma coating. In some embodiments, a carrier gas may be introduced from carrier gas pipe 109 to propagate the plasma throughout vacuum chamber 101. Controller 117 may transmit control signals that control the timing, power, and other operational parameters to radio frequency power source 103 to porous electrode 102. In some examples, continuous flow of carrier gas may occur during this step.

In step 307, a reactive species is generated for application to the surface of substrates 115 undergoing plasma polymerization. A reactive species is generated by activating the monomer vapor. A controller configures the polymerization of the monomer vapor by regulating the applied electrical power to the dispersal mechanism and/or by regulating the rate of gas that enters the dispersal mechanism for polymerization. In one embodiment, controller 117 transmits control signals to monomer vapor pipe 110 to introduce monomer vapor into vacuum chamber 101. Controller 117 also transmits control signals to discharge power source 108 to regulate the timing and amount of power to apply to discharge source 107. When power is applied from discharge power source 108 to discharge source 108, the carrier gas in discharge cavity 104 becomes plasma. This provides a mechanism to control when the discharge cavity 104 produces the plasma.

Additionally, controller 117 may provide control signals to pulse power source 106 to regulate the power applied to metal grid 105. Metal grid 105 is coupled to pulse power source 106 and arranged at the connecting positions of the discharge cavities and the inner walls of vacuum chamber 101. Metal grid 105 regulates the flow of the plasma generated in step 305 that enters vacuum chamber 101 and the backflow of carrier gas into discharge cavity 104. In some embodiments, controller 117 may provide control signals that control the timing and amount of carrier gas that is introduced into discharge cavity 104.

Specifically, when power is applied to metal grid 105, plasma can pass through metal grid 105, and when power is not applied to metal grid 105, plasma is blocked from passing through the metal grid 105. When the plasma travels through metal grid 105 into vacuum chamber 101, the plasma transfers energy to the monomer vapor to activate the monomer vapor to a high-energy state (i.e., the monomer vapor become activated species). In some embodiments, the carrier vapor may even cause some chemical bonds of the monomer to break and form reactive particles such as free radicals. Also, in some examples, continuous flow of carrier gas may occur during this step.

In step 308, the reactive species created in step 307 is deposited to the surface of substrates 115 undergoing plasma polymerization. Specifically, the polymerization reaction reactive species is generated from monomer vapor when the monomer vapor comes into contact with the plasma released in step 307 from discharge cavity 104. Activated by the carrier gas plasma, the generated polymerization reactive species are radially dispersed towards the axis of the vacuum chamber 101 and onto substrates 115. In some embodiments, after the reactive species is introduced to the vacuum chamber 101, the vacuum chamber 101 will have a combination of ionized species, free electrons, free radicals, excited molecules or atoms, and unchanged gas.

In step 309, the reactive species discharge method includes the step of collecting excess reactive species in the atmosphere of the reaction chamber by reducing the air pressure at the collecting tube to be lower than the air pressure of the reaction chamber. The exhaust rate of the vacuum pump is configured to account for: (1) the density decrease in the reactive species within the reaction chamber resulting from the deposition of the reactive species on to the substrate and (2) the density increase within the reactive species in the reaction chamber resulting from the reactive species converging toward the center of the chamber such that the density of the reactive species across the reaction chamber is uniform. Specifically, controller 117 transmits control signals to vacuum pump 116 to evacuate excess gas, plasma, and reactive species from the atmosphere of vacuum chamber 101. Vacuum pump 116 is coupled to tail gas collecting tube 111 to create a negative atmospheric pressure in tail gas collecting tube 111 relative to the atmospheric pressure of vacuum chamber 101. The negative atmospheric pressure creates a flow of gases out of vacuum chamber 101.

In some embodiments, step 306 (i.e., the pretreatment step) should be longer than one planetary rotation cycle, so that all the substrate samples have traveled to the closest point to the porous electrode to accept plasma. For example, step 306 may require between 1-30 minutes. In comparison, step 308 is determined by the film thickness required. In general, step 308 should take longer than the other steps. For example, step 306 may require between 20-300 minutes. Finally, step 309 should be executed until excess monomers are exhausted from the chamber. For example, step 309 may require between 1-10 minutes.

Processing System

Figure 4:
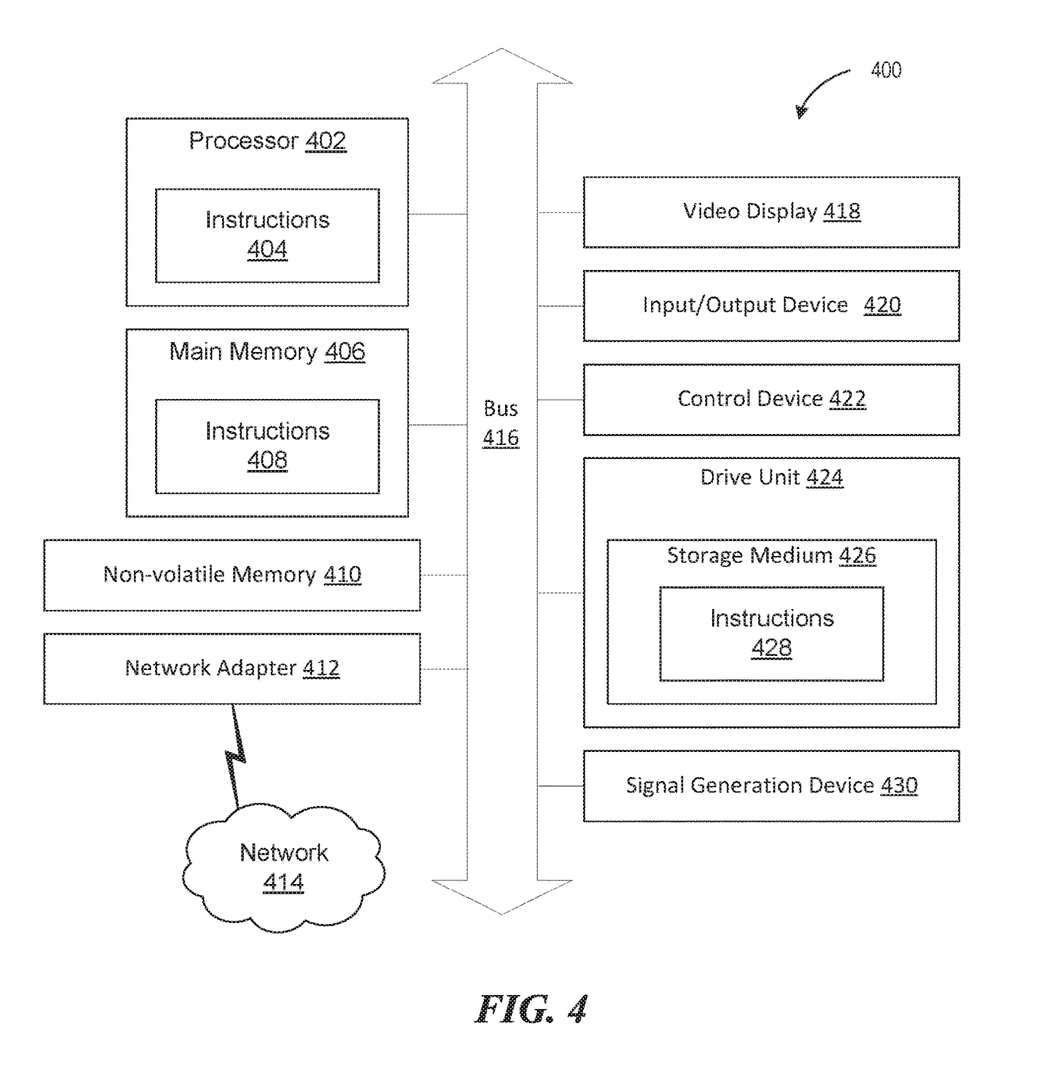
FIG. 4 is a block diagram illustrating an example of a processing system in which at least some operations described herein can be implemented.

FIG. 4 is a block diagram illustrating an example of a processing system 400 in which at least some operations described herein can be implemented. For example, some components of the processing system 400 may be implemented in a controller device (e.g., controller 117 of FIGS. 1 and 2).

The processing system 400 may include one or more central processing units ("processors") 402, main memory 406, non-volatile memory 410, network adapter 412 (e.g., network interface), video display 418, input/output devices 420, control device 422 (e.g., keyboard and pointing devices), drive unit 424 including a storage medium 426, and signal generation device 430 that are communicatively connected to a bus 416. The bus 416 is illustrated as an abstraction that represents one or more physical buses and/or point-to-point connections that are connected by appropriate bridges, adapters, or controllers. The bus 416, therefore, can include a system bus, a Peripheral Component Interconnect (PCI) bus or PCI-Express bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 1394 bus (also referred to as "Firewire").

The processing system 400 may share a similar computer processor architecture as that of a desktop computer, tablet computer, personal digital assistant (PDA), mobile phone, game console, music player, wearable electronic device (e.g., a watch or fitness tracker), network-connected ("smart") device (e.g., a television or home assistant device), virtual/augmented reality systems (e.g., a head-mounted display), or another electronic device capable of executing a set of instructions (sequential or otherwise) that specify action(s) to be taken by the processing system 400.

While the main memory 406, non-volatile memory 410, and storage medium 426 (also called a "machine-readable medium") are shown to be a single medium, the term "machine-readable medium" and "storage medium" should be taken to include a single medium or multiple media (e.g., a centralized/distributed database and/or associated caches and servers) that store one or more sets of instructions 428. The term "machine-readable medium" and "storage medium" shall also be taken to include any medium that is capable of storing, encoding, or carrying a set of instructions for execution by the processing system 400.

In general, the routines executed to implement the embodiments of the disclosure may be implemented as part of an operating system or a specific application, component, program, object, module, or sequence of instructions (collectively referred to as "computer programs"). The computer programs typically comprise one or more instructions (e.g., instructions 404, 408, 428) set at various times in various memory and storage devices in a computing device. When read and executed by the one or more processors 402, the instruction(s) cause the processing system 400 to perform operations to execute elements involving the various aspects of the disclosure.

Moreover, while embodiments have been described in the context of fully functioning computing devices, those skilled in the art will appreciate that the various embodiments are capable of being distributed as a program product in a variety of forms. The disclosure applies regardless of the particular type of machine or computer-readable media used to actually effect the distribution.

Further examples of machine-readable storage media, machine-readable media, or computer-readable media include recordable-type media such as volatile and non-volatile memory devices 410, floppy and other removable disks, hard disk drives, optical disks (e.g., Compact Disk Read-Only Memory (CD-ROMS), Digital Versatile Disks (DVDs)), and transmission-type media such as digital and analog communication links.

The network adapter 412 enables the processing system 400 to mediate data in a network 414 with an entity that is external to the processing system 400 through any communication protocol supported by the processing system 400 and the external entity. The network adapter 412 can include a network adaptor card, a wireless network interface card, a router, an access point, a wireless router, a switch, a multilayer switch, a protocol converter, a gateway, a bridge, bridge router, a hub, a digital media receiver, and/or a repeater.

The network adapter 412 may include a firewall that governs and/or manages permission to access/proxy data in a computer network and tracks varying levels of trust between different machines and/or applications. The firewall can be any number of modules having any combination of hardware and/or software components able to enforce a predetermined set of access rights between a particular set of machines and applications, machines and machines, and/or applications and applications (e.g., to regulate the flow of traffic and resource sharing between these entities). The firewall may additionally manage and/or have access to an access control list that details permissions including the access and operation rights of an object by an individual, a machine, and/or an application, and the circumstances under which the permission rights stand.

The foregoing description of various embodiments of the claimed subject matter has been provided for the purposes of illustration and description. It is not intended to be exhaustive or to limit the claimed subject matter to the precise forms disclosed. Many modifications and variations will be apparent to one skilled in the art. Embodiments were chosen and described in order to best describe the principles of the invention and its practical applications, thereby enabling those skilled in the relevant art to understand the claimed subject matter, the various embodiments, and the various modifications that are suited to the particular uses contemplated.

Although the Detailed Description describes certain embodiments and the best mode contemplated, the technology can be practiced in many ways no matter how detailed the Detailed Description appears. Embodiments may vary considerably in their implementation details, while still being encompassed by the specification. Particular terminology used when describing certain features or aspects of various embodiments should not be taken to imply that the terminology is being redefined herein to be restricted to any specific characteristics, features, or aspects of the technology with which that terminology is associated. In general, the terms used in the following claims should not be construed to limit the technology to the specific embodiments disclosed in the specification, unless those terms are explicitly defined herein. Accordingly, the actual scope of the technology encompasses not only the disclosed embodiments, but also all equivalent ways of practicing or implementing the embodiments.

The language used in the specification has been principally selected for readability and instructional purposes. It may not have been selected to delineate or circumscribe the subject matter. It is therefore intended that the scope of the technology be limited not by this Detailed Description, but rather by any claims that issue on an application based hereon. Accordingly, the disclosure of various embodiments is intended to be illustrative, but not limiting, of the scope of the technology as set forth in the following claims.

What is claimed is:

1. An apparatus for performing plasma polymerization on the surface of one or more substrates, the apparatus comprising:
   a reaction chamber that comprises:
      a primary rotation rack operably coupled to a primary rotation shaft and configured to rotate along a central axis, the primary rotation rack including one or more arms extending from the primary rotation shaft and away from the central axis;
      a secondary rotation rack operably coupled to a secondary rotation shaft and configured to rotate on a secondary axis that is distal from the central axis, the secondary rotation shaft coupled to an arm of the one or more arms extending from the primary rotation shaft; and
      one or more substrate platforms coupled to the secondary rotation shaft configured to carry the one or more substrates that are to receive the plasma polymerization coating;
   a dispersal mechanism positioned around a perimeter of the reaction chamber, the dispersal mechanism comprising:
      at least two discharge cavities evenly spaced around the perimeter of the reaction chamber, wherein each of the at least two discharge cavities comprises a discharge source coupled to a first power source, the discharge source configured to ionize, in each discharge cavity, a carrier gas into plasma that is to be released into the reaction chamber;

a porous electrode placed between the at least two discharge cavities and the primary rotation rack, wherein the porous electrode is coupled to a second power source and is configured to generate plasma in the reaction chamber before or after the surface of the one or more substrate is coated, wherein the porous electrode is shared by the at least two discharge cavities;

a rotation motor configured to rotate the primary rotation shaft and primary rotation rack at a controlled rotation rate, and wherein the first power source and the second power source are configured to apply one or more power levels to the dispersal mechanism.

2. The apparatus of claim 1, wherein the dispersal mechanism is configured to disperse reactive species toward the central axis of the reaction chamber, such that the reactive species form a polymeric coating on surfaces of the one or more substrates.

3. The apparatus of claim 2, wherein the dispersal mechanism is configured to control a dispersal rate of the reactive species in a substantially even manner on the one or more substrates.

4. The apparatus of claim 3, wherein the dispersal rate of the reactive species is controlled by regulating a rate of the carrier gas that enters the dispersal mechanism for polymerization.

5. The apparatus of claim 4, wherein the dispersal rate is adjusted to account for a density decrease in the reactive species within the reaction chamber resulting from a deposition of the reactive species on to the one or more substrates and a density increase within the reactive species in the reaction chamber resulting from the reactive species converging toward a center of the chamber such that a density of reactive species across the reaction chamber is uniform.

6. The apparatus of claim 1, wherein the dispersal mechanism further includes at least two metal grids each positioned between a discharge cavity of the at least two discharge cavities and the reaction chamber to create a pressure differential between the discharge cavity and the reaction chamber, each of the at least two metal grids further configured to reduce or prevent gas backflow from the reaction chamber to the corresponding discharge cavity.

7. The apparatus of claim 6, wherein the second power source is coupled to a metal grid of the at least two metal grids, the second power source configured to provide a positive electrical charge to the metal grid in pulses, wherein plasma in the corresponding discharge cavity is blocked from entering the reaction chamber during a pulse-off period, and the plasma in the corresponding discharge cavity is passed through to the reaction chamber during a pulse-on period.

8. The apparatus of claim 1, further comprising:

a collecting tube positioned along the central axis of the reaction chamber and operable to have an air pressure lower than the reaction chamber to collect excess reactive species from the reaction chamber at an exhaust rate.

9. The apparatus of claim 8, wherein the collecting tube is configured to control the exhaust rate of the excess reactive species.

10. The apparatus of claim 9, wherein the exhaust rate is adjusted to account for a density decrease in the reactive species within the reaction chamber resulting from a deposition of the reactive species on to the one or more substrates and a density increase within the reactive species in the reaction chamber resulting from the reactive species converging toward a center of the chamber such that a density of reactive species across the reaction chamber is uniform.

11. The apparatus of claim 1, wherein the reaction chamber includes one or more rack layer, each rack layer holding a plurality of substrates from the one or more substrate platforms.

12. The apparatus of claim 1, wherein a rotation of the primary rotation rack along the central axis and a rotation of the secondary rotation rack along the secondary axis provides a same rate of spatial movement for each of the one or more substrates during the coating stage in order to achieve uniform coating.

13. The apparatus of claim 1, wherein the second power source comprises:

a radio frequency power supply coupled to the porous electrode, the radio frequency power supply configured to provide an electrical charge to the porous electrode to produce a treatment plasma, in the pre-treatment stage, to remove impurities from the surface of the one or more substrates.

14. The apparatus of claim 1, wherein the dispersal mechanism further comprises a vapor pipe connected directly to the reaction chamber to provide a vapor for forming reactive species with the carrier gas, wherein an outlet of the vapor pipe is positioned at a distance from the at least two discharge cavities to provide the vapor directly into the reaction chamber without passing through the at least two discharge cavities.

15. The apparatus of claim 14, wherein the distance from a discharge cavity of the at least two discharge cavities ranges from 1 to 10 cm.

16. The apparatus of claim 1, wherein a power level of the second power source is configured to to be higher than a power level of the first power source.

17. The apparatus of claim 1, wherein a power level of the first power source to be in a range of 2 to 500 W.

18. The apparatus of claim 1, wherein a power level of the second power source to be greater than 600 W.

* * * * *